(12) United States Patent
Ominami et al.

(10) Patent No.: US 8,086,021 B2
(45) Date of Patent: Dec. 27, 2011

(54) APPEARANCE INSPECTION APPARATUS WITH SCANNING ELECTRON MICROSCOPE AND IMAGE DATA PROCESSING METHOD USING SCANNING ELECTRON MICROSCOPE

(75) Inventors: Yusuke Ominami, Hitachinaka (JP); Hiroshi Miyai, Hitachi (JP); Yasuhiro Gunji, Hitachiota (JP)

(73) Assignee: Hitachi High-Technologies Corporation, Tokyo (JP)

( * ) Notice: Subject to any disclaimer, the term of this patent is extended or adjusted under 35 U.S.C. 154(b) by 433 days.

(21) Appl. No.: 12/367,695

(22) Filed: Feb. 9, 2009

(65) Prior Publication Data

US 2009/0208092 A1 Aug. 20, 2009

(30) Foreign Application Priority Data

Feb. 15, 2008 (JP) ................................. 2008-035106

(51) Int. Cl.
*G06K 9/00* (2006.01)
(52) U.S. Cl. ........................................................ 382/141
(58) Field of Classification Search ........... 382/141–152
See application file for complete search history.

(56) References Cited

U.S. PATENT DOCUMENTS

| | | | | |
|---|---|---|---|---|
| 6,476,388 B1 * | 11/2002 | Nakagaki et al. | ................. | 850/9 |
| 6,538,248 B1 * | 3/2003 | Kametani et al. | ............. | 250/310 |
| 6,580,075 B2 * | 6/2003 | Kametani et al. | ............. | 250/310 |
| 7,442,929 B2 * | 10/2008 | Kitsuki et al. | ................. | 250/310 |
| 7,932,494 B2 * | 4/2011 | Zhang | ............................ | 250/306 |
| 7,991,217 B2 * | 8/2011 | Nakagaki et al. | ............. | 382/149 |
| 2003/0062479 A1 * | 4/2003 | Kametani et al. | ............. | 250/310 |
| 2006/0108525 A1 * | 5/2006 | Nakagaki et al. | ............. | 250/310 |
| 2006/0226362 A1 * | 10/2006 | Kitsuki et al. | ................. | 250/310 |
| 2007/0201739 A1 * | 8/2007 | Nakagaki et al. | ............. | 382/149 |
| 2009/0026369 A1 * | 1/2009 | Miyai et al. | ..................... | 250/310 |
| 2009/0050805 A1 * | 2/2009 | Kitsuki et al. | ................. | 250/311 |
| 2009/0208092 A1 * | 8/2009 | Ominami et al. | ............. | 382/149 |
| 2009/0296991 A1 * | 12/2009 | Anzola | ......................... | 382/107 |
| 2010/0224792 A1 * | 9/2010 | Zhang | ........................ | 250/442.11 |
| 2010/0320385 A1 * | 12/2010 | Kitsuki et al. | ................. | 250/310 |

FOREIGN PATENT DOCUMENTS

| | | |
|---|---|---|
| JP | 2-142045 | 5/1990 |
| JP | 05-055919 | 3/1993 |
| JP | 2007-220615 | 8/2007 |

OTHER PUBLICATIONS

Japanese Office Action issued in Japanese Patent Application No. JP 2008-035106 dated Jul. 13, 2010.

* cited by examiner

*Primary Examiner* — Patrick J Connolly
(74) *Attorney, Agent, or Firm* — McDermott Will & Emery LLP

(57) ABSTRACT

The present invention provides an appearance inspection apparatus that allows a user to give precedence to either defect detection performance or throughput. The appearance inspection apparatus allows a user to select the frequency of a digital image signal or the ratio of the frequency of the digital image signal to a sampling rate. Further, a user is allowed to select either throughput improvement or S/N improvement to prioritize.

17 Claims, 7 Drawing Sheets

APPEARANCE INSPECTION APPARATUS WITH SCANNING ELECTRON MICROSCOPE AND IMAGE DATA PROCESSING METHOD USING SCANNING ELECTRON MICROSCOPE

BACKGROUND OF THE INVENTION

1. Field of the Invention

The present invention relates to appearance inspection apparatuses for inspecting defects in samples and more particularly relates to technology for inspecting the appearance of samples by use of scanning electron microscopes (SEM).

2. Description of the Related Art

Memories used in computers and the like, and semiconductor devices such as microcomputers are produced in the following manner: a pattern such as a circuit formed on a photo mask is repeatedly transferred by an exposure process, lithographic process, etching process, or the like. In semiconductor device manufacture, the results of lithographic, etching, or other processes, and defects caused by, for example, foreign matter significantly affect the manufacturing yield of semiconductor devices. Therefore, it is necessary to detect abnormalities or faults at an early stage or in advance. In order to detect these, patterns on semiconductor wafers are inspected at the end of each manufacturing process.

High throughput and highly accurate inspection are required to cope with larger diameter wafers and finer circuit pattern. This requires extremely high speed capturing of image data that has a high S/N ratio. For this purpose, a large electric current beam (100 nA or greater) 1000 times that of an ordinary scanning electron microscope (SEM) or greater is used, thereby obtaining the required number of electrons and maintaining a high S/N ratio. It is necessary to detect as speedily and efficiently as possible secondary or reflected electrons generated by a substrate.

Japanese Patent Application Laid-Open (JP-A) No. 2-142045 discloses the technology in which using an E×B filter, only a secondary electron beam is deflected toward a detector so as not to interfere with a primary electron beam.

In an inspection apparatus using such a scanning electron microscope (SEM), the quantity of electron beam emitted onto a sample is insufficient, resulting in inadequate contrast. To overcome such a problem, the time for which the electron beam is emitted is increased per pixel, and the sampling rate at which a digital luminance signal is generated from an analog luminance signal outputted from a detector is lowered below the standard value. Altering the sampling rate requires a process or device for altering a clock period.

JP-A No. 05-55919 discloses a method for operating a low resolution AD converter at high resolution. In this method, every predetermined number of successive sampling signals supplied from the AD converter are added and the result is then divided. This yields a digital signal with higher resolution.

According to the technology described in JP-A No. 05-55919, one pixel is created using each of the digital values of the final digital image signals obtained as the result of addition and division. The time for which an image is captured is obtained by multiplying the period of the final digital image signal by the number of pixels constituting one image screen. Accordingly, as the period of the final digital image signal is short, the time for which the image is captured is shortened. Accordingly, the throughput is improved.

However, if the period of the final digital image signal is shortened, scanning speed must also be increased, which would decrease the intensity of a luminance signal, and hence the S/N ratio. Any decrease in the S/N ratio degrades accuracy in defect detection.

If the period of the final digital image signal is lengthened, on the other hand, the scanning speed must be decreased, which would increase the strength of a luminance signal and hence the S/N ratio. The increase in S/N ratio improves accuracy in defect detection. However, the time for which an image is captured is lengthened and, accordingly, the throughput degrades.

That is, in the appearance inspection apparatus with the scanning electron microscope, the relation between defect detection performance and throughput is a trade-off. Generally, a user desires to give precedence to defect detection performance over throughput or vice versa, as necessity requires. However, conventional technology does not allow a user to give precedence to defect detection performance over throughput or vice versa as a user's desire.

SUMMARY OF THE INVENTION

It is an object of the present invention to provide an appearance inspection apparatus that allows a user to give precedence to defect detection performance over throughput, or vice versa.

According to the present invention, an appearance inspection apparatus includes: a scanning deflector for scanning a surface of a sample with an electron beam; an objective lens for focusing the electron beam onto the sample; a detector for producing an analog luminance signal by detecting a secondary electron or reflected electron generated by the sample; an AD conversion element for sampling the analog luminance signal at a predetermined sampling rate; a digital signal processor for producing a digital image signal from a sampling signal obtained by the AD conversion element, the digital image signal having a lower frequency than the sampling rate; an image processor for forming an image in which each of the digital values of the digital image signal constitutes one pixel; and an input device for allowing a user to enter data.

According to the present invention, the user is allowed to select the frequency of the digital image signal or a ratio of the frequency of the digital image signal to the sampling rate. Further, the user is allowed to select either throughput improvement or S/N improvement to give precedence to selected one.

According to the present invention, if the user selects the throughput improvement to prioritize, the appearance inspection apparatus sets the frequency of the digital image signal or scanning speed to a relatively large value, while if the user selects the S/N improvement to prioritize, the appearance inspection apparatus sets the frequency of the digital image signal or scanning speed to a relatively small value.

The present invention allows a user to give precedence to S/N improvement over throughput improvement, or vice versa.

DETAILED DESCRIPTION OF THE PREFERRED EMBODIMENTS

The present invention is applicable in any device that captures an image by use of a scanning electron microscope. However, the description below is given using an example where the present invention is applied in an SEM type appearance inspection apparatus.

Figure 1:
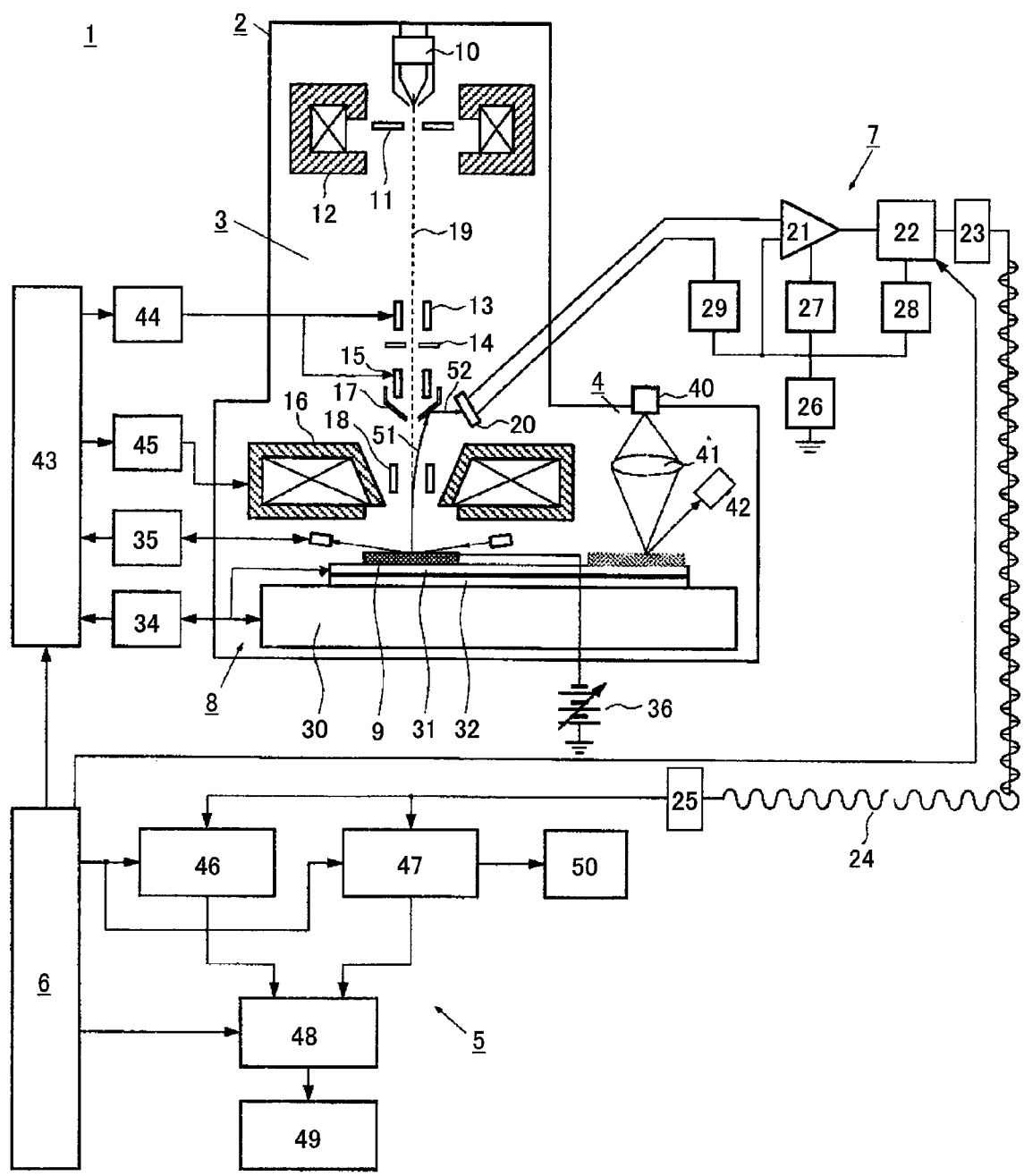
FIG. 1 is a view for illustrating the configuration of an SEM type appearance inspection apparatus of the present invention.

An example of the configuration of an SEM type appearance inspection apparatus according to this example will be described with reference to FIG. 1. The SEM type appearance inspection apparatus 1 includes an inspection chamber 2. The inspection chamber 2 has an electron optical system device 3, optical microscope 4, and sample chamber 8.

The electron optical system device 3 has an electron gun 10, an extraction electrode 11 for electron beams, a condenser lens 12, a blanking deflector 13, an aperture 14, a scanning deflector 15, an objective lens 16, a conical beam reflector 17, an E×B deflector 18, and a secondary electron detector 20. The blanking deflector 13 deflects an electron beam 19 to the outside of the opening of the aperture 14, thereby avoiding emission of the electron beam 19 onto a sample 9, if this is so required. The E×B deflector 18 bends the orbit of a secondary electron by means of both electric field and magnetic field without affecting the orbit of the electron beam 19.

The optical microscope 4 has a white light source 40, optical lens 41, and CCD camera 42, and is disposed near the electron optical system device 3. The electron optical system device 3 and optical microscope 4 are sufficiently separate so as not to interfere with each other. The distance between them is known.

The sample chamber 8 has a sample support 30, X stage 31, Y stage 32, and a high voltage power source 36. In this example, the sample 9 is a semiconductor wafer. A negative voltage is applied to the sample 9 by the high voltage power source 36. Adjusting voltage supplied from the high voltage power source 36 can decelerate the speed of the electron beam 19 being emitted onto the sample 9. Thus, without changing the potential of the electron gun 10, the energy of the electron beam to be emitted onto the sample 9 can be adjusted to the optimum value.

The X stage 31 or Y stage 32 can alternately move the sample 9 backward and forward between the electron optical system device 3 and optical microscope 4.

The SEM type appearance inspection apparatus 1 further includes an image processor 5, control unit 6, secondary electron detecting unit 7, position-monitoring length-measuring device 34, inspected sample height measuring device 35, correction control circuit 43, scanning signal generator 44, and objective lens power source 45.

The image processor 5 includes a first image storage section 46, second image storage section 47, differential image arithmetic section 48, defect determining section 49, and monitor 50. The image processor 5 additionally includes an input device, into which a user enters data or a command. Operating commands and operating conditions for each of the sections of the image processor 5 are input to or output from the control unit 6.

The secondary electron detecting unit 7 has a preamplifier 21, AD converter 22, optical conversion means 23, optical transmission means 24, electric conversion means 25, high voltage power source 26, preamplifier driving power source 27, AD converter driving power source 28, and reverse bias power source 29. The second electron detector 20, preamplifier 21, AD converter 22, optical conversion means 23 preamplifier driving power source 27, and AD converter driving power source 28 have been floated at a positive potential by means of the high voltage power source 26. The secondary electron detector 20 generates an attracting electric field by means of this positive potential.

The position-monitoring length-measuring device 34 monitors the positions of the X stage 31 and Y stage 32 in real time and transmits the position information to the control unit 6 via the correction control circuit 43. The inspected sample height measuring device 35 measures the height of the sample 9 in real time and transmits the measured information to the control unit 6 via the correction control circuit 43. In this example, a elongated beam of white light having passed through a slit is emitted onto the sample 9 through a transparent window by the sample height measuring unit 35, the position of the reflected light is detected by a position detecting monitor, and the amount of change in height is calculated from the change in position of the reflected light.

Based on data inputted via the correction control circuit 4, the control unit 6 generates a correction signal and transmits it to the correction control circuit 43. The correction control circuit 43 transmits a correction signal for the objective lens 16 to the objective lens power source 45, and also transmits a correction signal for the blanking deflector 13 to the scanning signal generator 44. Thereby, the irradiation position with the electron beam 19 is controlled. Even if sample 9 is replaced, the control unit 6 stores, for each sample, a record of the area which has been irradiated with the electron beam.

In the control unit 6, conditions, such as: the accelerating voltage applied during the generation of an electron beam, the width of deflection of an electron beam, the deflecting speed, the timing of capturing of a signal from the secondary electron detector 20, or the movement speed of the sample support 30, are inputted in advance so as to be able to be set arbitrarily or selectively in accordance with the purpose.

Next, the procedure for inspecting a sample, namely a semiconductor wafer, by means of the SEM type appearance inspection 1 according to this example will be described. The sample 9 is loaded into a sample replacement chamber (not shown). After the sample 9 is placed and firmly held in a sample holder (not shown), the sample replacement chamber is evacuated to create vacuum in. When the sample replacement chamber reaches a certain degree of evacuation, the sample 9 is transferred to the inspection chamber 2. In the inspection chamber 2, along with the sample holder, the sample 9 is placed on and firmly held by the sample support 30 via the X stage 31 and Y stage 32 while being mounted on the sample holder. A pre-registered condition for irradiating with an electron beam is set and calibration such as focusing is carried out.

First, preparation is made using the optical microscope 4. By moving the X stage 31 and Y stage 32 in X and Y direction, the sample 9 is disposed in a predetermined location below the optical microscope 4. The CCD camera 42 observes an optical microscope image of a circuit pattern formed on the sample 9. The positions of chips with circuit patterns, the distance between the chips, the pitch of repetition of the repetition pattern as shown in memory cell, and the like are measured and these dimensions are inputted to the control unit 6. In addition, a chip to be inspected and an area to be inspected of the chip are specified and inputted to the control unit 6. An optical microscope image is observable with a relatively low magnification. If the surface of the sample 9 is covered with, for example, a silicon oxide film, its substrate transmits light and can be observed. This enables easy observation of the chip array and the layout of the circuit pattern in each chip, and easy setting of an area to be inspected.

After any predetermined correction and preparation required such as the setting of an inspecting area have been conducted using the optical microscope 4 in the manner described above, the sample 9 is moved below the electron optical system device 3 by moving the X stage 31 and Y stage 32. Upon location of the sample 9 below the electron optical system device 3, the electron optical system device 3 carries out operations similar to the corrections and the setting of an inspecting area already carried out by the optical microscope 4. Since simply checking of the area to be inspected, alignment, and position adjustment as well as a rotation correction have been conducted in advance using the optical microscope image, the need for great adjustment is obviated.

By applying a voltage to between the electrode gun 10 and the extraction electrode 11, an electron beam 19 is extracted from the electron gun 10. The electron beam 19 is emitted onto the sample 9 via the condenser lens 12, aperture 14, scanning deflector 15, and objective lens 16. Based on the corrected coordinate values stored as a result of the alignment made using the optical microscope image, a circuit pattern identical to that observed by the optical microscope 4 is two-dimensionally scanned with the electron beam 19 in the X and Y directions by the scanning deflector 15.

Upon emission of the electron beam 19 onto the sample 9, a secondary electron 51 is generated by the sample 9. The orbit of the secondary electron 51 is bent by the E×B deflector 18 and the secondary electron 51 is emitted onto the beam reflector 17. Consequently, a second secondary electron 52 with an energy of several to 50 of electron volts is generated. The secondary electron 52 is attracted to an attracting electrode formed of the secondary electron detector 20, and is detected by the secondary electron detector 20. Here, a description is given using as an example a secondary electron generated by the sample. However, this electron may be an electron reflected from the sample.

An analog luminance signal from the secondary electron detector 20 is amplified by the preamplifier 21 of the secondary electron detecting unit 7 and converted into a digital signal by the AD converter 22. The digital luminance signal is transmitted from the optical conversion means 23 to the electric conversion means 25 of the image processor 5 by the optical transmission means 24 such as an optical fiber.

The electric conversion means 25 of the image processor 5 re-converts an image signal, inputted via the optical transmission means 24, into an electric signal. Images from the electric conversion means 25 are cut out and alternately stored into two image storage sections 46 and 47. The differential image arithmetic section 48 compares the images from the two image storage sections 46 and 47 and creates a differential image. The defect determining section 49 determines from the differential image the presence or absence of any defect and its defect type. The monitor 50 displays the defect position, defect type, the number of defects and the like.

Figure 2:
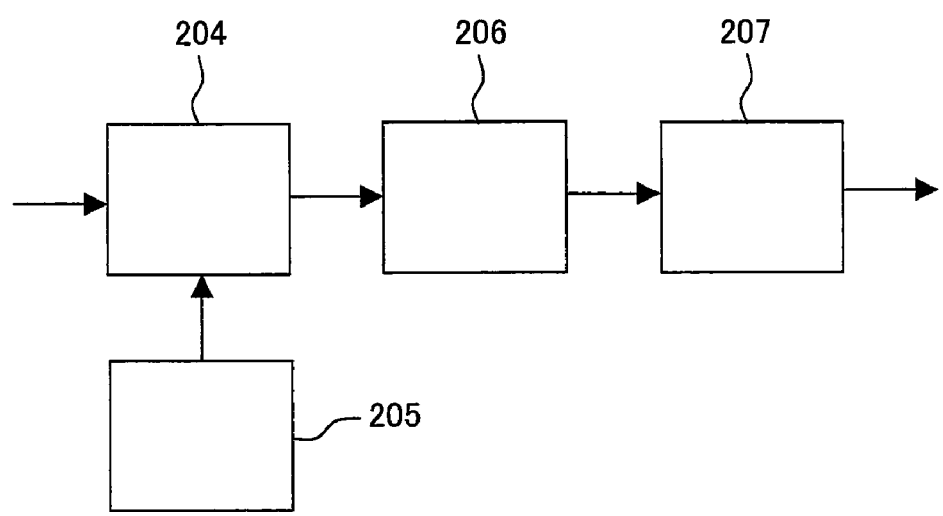
FIG. 2 is a view for illustrating an example of the configuration of the AD converter of the secondary electron detector of the SEM type appearance inspection apparatus of the present invention.

Referring to FIG. 2, an example of the configuration of the AD converter 22 of the secondary electron detecting unit 7 of the SEM type appearance inspection apparatus in the present invention will be described. The AD converter 22 according to this example has an AD conversion element 204, a clock generating circuit 205, and a digital signal processing circuit 206. A sampling rate is determined by the frequency of a clock signal supplied by the clock generating circuit 205.

The analog luminance signal from the secondary electron detector 20 is amplified by the preamplifier 21 and transmitted to the AD conversion element 204 disposed in the AD converter 22. In synchronization with the clock signal from the clock generating circuit 205, the AD conversion element 204 samples the analog luminance signal and produces a digital signal. That is, the AD conversion element 204 samples the analog luminance signal at the same sampling rate as the frequency of the clock signal. The digital signal processing circuit 206 subjects the digital signal to data processing. The data-processed signal is transmitted to the optical conversion means 23, shown in FIG. 1, from a digital data transmitting section 207.

Figure 3:
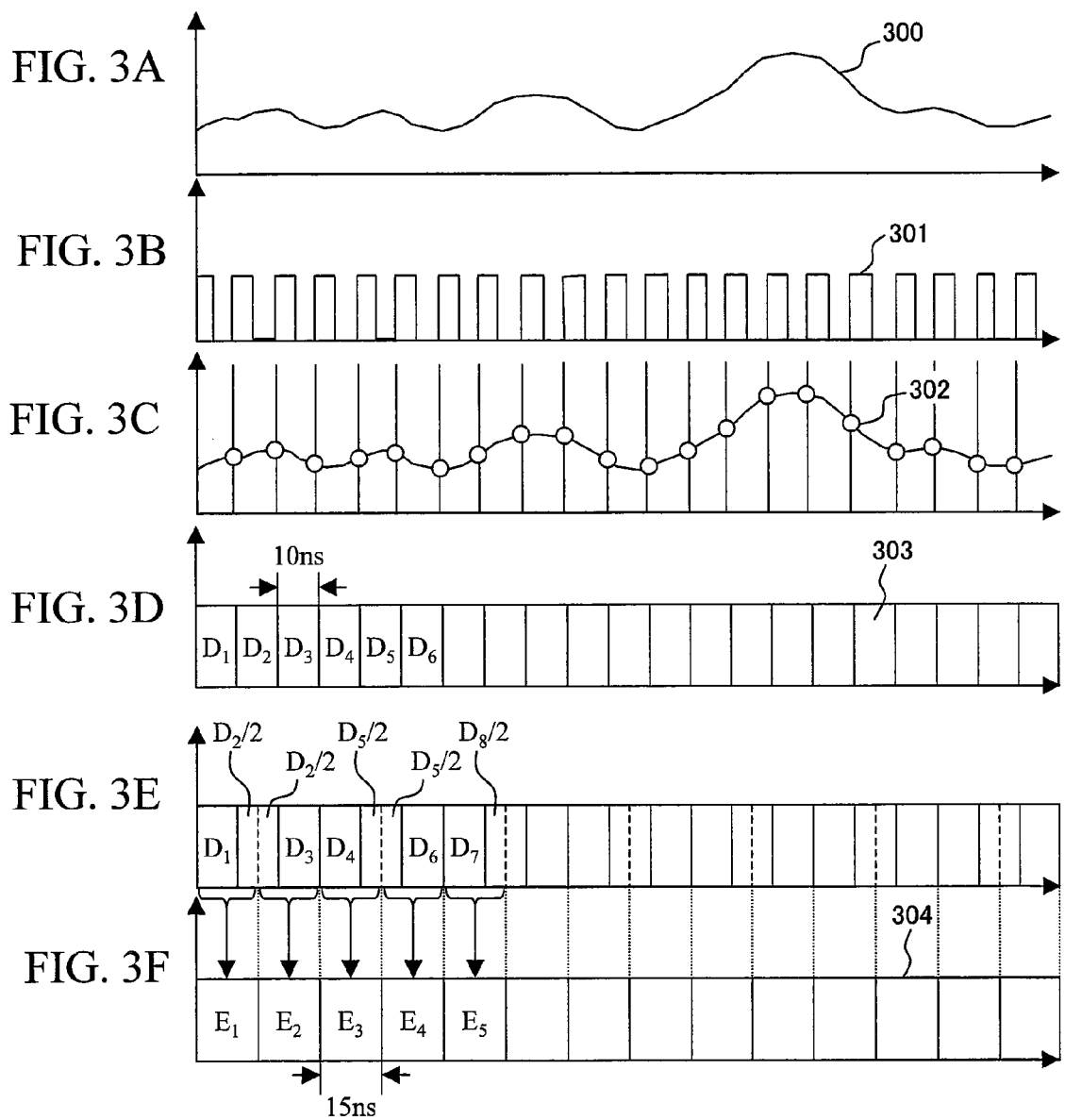
FIG. 3A-FIG. 3F are views for illustrating an example of an addition process and averaging process performed by the digital signal processing circuit of the secondary electron detector of the SEM type appearance inspection apparatus of the present invention.

Referring to FIG. 3A-FIG. 3F, a first example of data processing performed by the digital signal processing circuit 206 according to the present invention will now be described. In this example, two successive pixel data are created from three successive sampling signal values. A digital image signal with a frequency of two-thirds of the sampling rate is thus obtained. FIG. 3A shows the temporal change in strength of an analog signal 300, supplied to the AD converter 22. The horizontal axis indicates time. The analog signal 300 represents the level of a signal outputted from the secondary electron detector 20. FIG. 3B shows the clock signal 301 of the clock generating circuit 205. The frequency of the clock signal 301 indicates the sampling frequency, that is, the sampling rate. FIG. 3C shows the result of sampling the analog signal 300 at a rise of the clock signal 301. This processing is performed by the AD conversion element 204. The evenly spaced vertical lines in FIG. 3C indicate rises of the clock signal 301 and the circle on each of the vertical lines indicates the sampling signal 302.

FIG. 3D shows the digital form into which the sampling signal 302 is converted. A rectangle 303 on the horizontal axis is formed each time the clock signal 301 rises. Each of the rectangles 303 stores the sampling signal 302 as a digital value. The first three digital values obtained by sampling are each represented by D1, D2, and D3.

FIG. 3E shows the result of a division process performed by the digital signal processing circuit 206. Each series of three successive digital values is subjected to the division process such that the middle digital value in its series is divided by two. That is, the digital value that is the (3k−1)th (where k is a natural number) one is divided by 2. In the example shown in FIG. 3E, only the digital value D2 among three successive digital values, D1, D2, and D3, is divided by 2. As a result, D2/2 is obtained. The digital values D1 and D3 are not divided and remain as they are.

FIG. 3F shows the result of an addition process performed by the digital signal processing circuit 206. A rectangle 304 is formed on the horizontal axis at intervals 1.5 times those of the clock signal 301. Each of the rectangles stores pixel data obtained by this addition process. The first three pixel data obtained by this addition process are each represented by E1, E2, and E3.

In the addition process, the first digital value and a half of the second digital value of each series of three successive digital values shown in FIG. 3D are added to create one pixel datum; and the third digital value and a half of the second digital value are added to create another pixel datum. Accordingly, the first pixel datum is given by E1=D1+(D2/2); the second pixel datum is given by E2=(D2/2)+D3; and the third pixel datum is given by E3=D4+(D5/2). That is, the odd-ordinal numbered pixel datum is given by E(2k−1)=D(3k−2)+D(3k−1)/2, and the even-ordinal numbered pixel datum is given by E(2k)=D(3k−1)/2+D(3k). Here, k is a positive integer.

Compared FIG. 3D to FIG. 3F, in this example, a digital image signal with a period 1.5 times that of the clock signal 301 is obtained. That is, a digital image signal with a frequency of two-thirds of the sampling rate is obtained.

An image is formed using the digital image signal finally thus obtained. If the frequency of the clock signal 301 in FIG. 3B is 100 Mhz (period 10 ns), the frequency of the digital image signal in FIG. 3F is about 66.7 MHz (period 15 ns). It is assumed that one row of pixels is formed by one scan of an electron beam. It is further assumed that one row has 1024 pixels. Additionally, the timing for creating data corresponding to one row of pixel data is synchronized with that for each scan. The time required for one scan is 15 ns×1024=15.36 μs. Accordingly, 1024-pixel data are transmitted to a digital data transmitting section 207 every 15.36 μs.

Next, referring to FIG. 4A-FIG. 4F, a first example of data processing performed by the digital processing circuit 206 according to the present invention will be described. In this example, four successive pixel data are created from five successive sampling signal values. Accordingly, a digital image signal with a frequency of four-fifths of the sampling rate is obtained.

Figure 4:
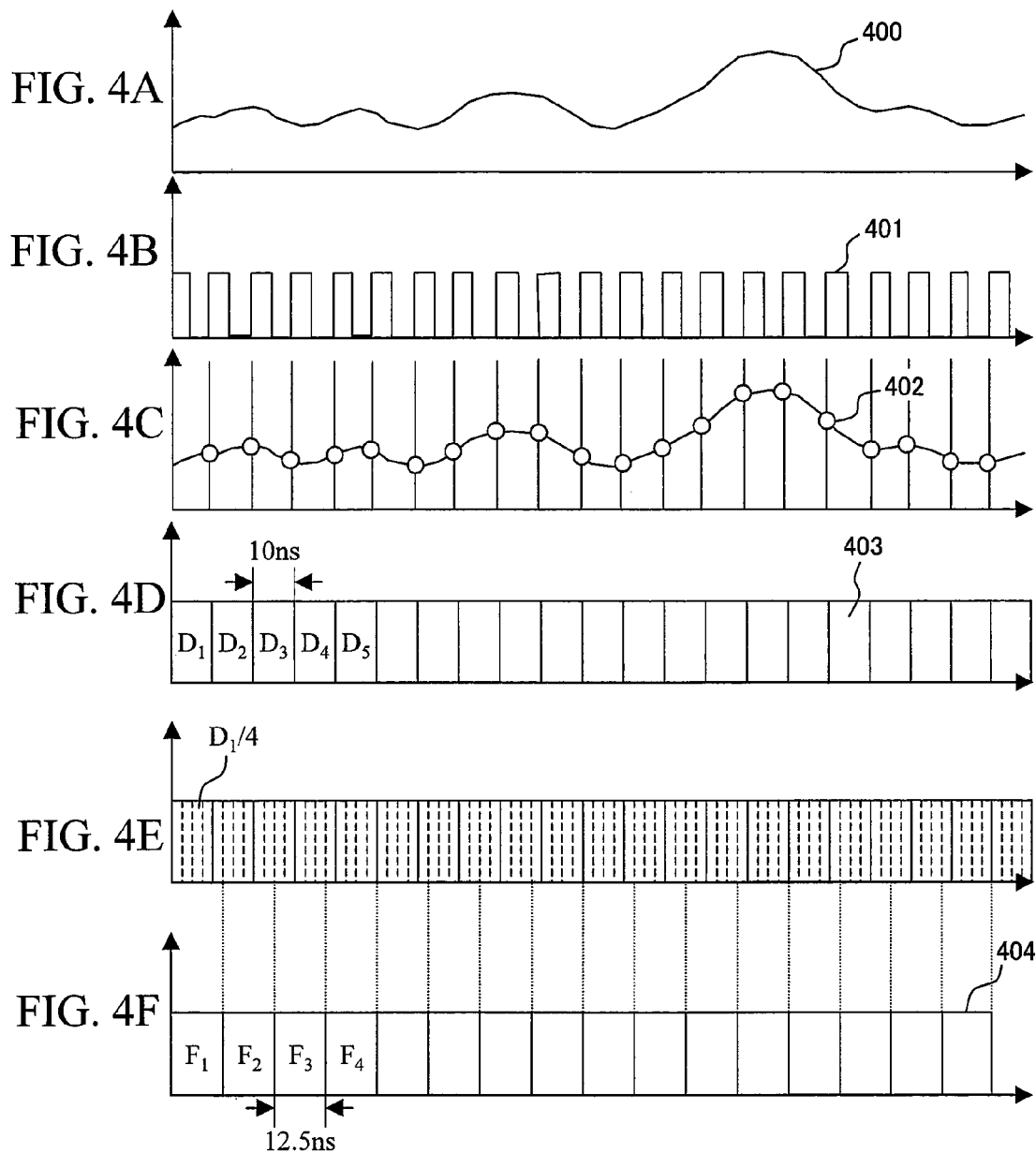
FIG. 4A-FIG. 4F are views for illustrating another example of the addition process and averaging process performed by the digital signal processing circuit of the secondary electron detector of the SEM type appearance inspection apparatus of the present invention.

The processes from FIG. 4A to FIG. 4D are similar to those from FIG. 3A to FIG. 3D. FIG. 4A shows the temporal change in the strength of an analog signal 400, supplied to the AD converter 22. FIG. 4B shows the clock signal 401 of the clock generating circuit 205. FIG. 4C shows a signal 402 obtained as a result of sampling an analog single 400 at a rise of the clock signal 401. FIG. 4D shows a signal 403 produced as a result of converting the sampling signal 402 into digital form. A rectangle 403 on the horizontal axis is formed each time the clock signal 401 rises. Each rectangle 403 stores a digital value for use as a sampling signal 302. The first five digital values obtained by sampling are each represented by D1, D2, D3, D4, and D5.

FIG. 4E shows the result of a division process performed by the digital signal processing circuit 206. In this process, each of digital values is divided by four. Consequently, the digital values D1, D2, D3, D4, and D5 yield D1/4, D2/4, D3/4, D4/4, and D5/4 respectively.

FIG. 4F shows the result of an addition process performed by the digital signal processing circuit 206. A rectangle 404 on the horizontal axis is formed on a horizontal axis at a rate equal to a period 1.25 times that of a clock signal 301. Each of the rectangles stores pixel data obtained by addition process. The first four pixel data obtained by addition process are each represented by F1, F2, F3, and F4. In this addition process, a series of two successive digital values are picked in order from the five digital values D1/4, D2/4, D3/4, D4/4, and D5/4, which are obtained in the process of FIG. 4E. Next, the two successive digital values thus picked are multiplied by their respective coefficients to be added.

Accordingly, the first pixel datum is given by F1=(4×D1/4+(D2/4); the second pixel datum is given by F2=(3×D2/4)+(2×D3/4); the third pixel datum is given by F3=(2×D3/4)+(3×D4/4); and the fourth pixel datum is given by F4=(D4/4)+(4×D5/4).

Generally, (5k−4)-th pixel datum is given by F(5k−4)=(4×D(5k−4)/4)+(1×D(5k−3)/4; (5k−3)-th pixel datum is given by F(5k−3)=(3×D(5k−3)/4)+(2×D(5k−2)/4; (5k−2)-th pixel datum is given by F(5k−2)=(2×D(5k−2)/4)+(3×D(5k−1)/4; and (5k−1)-th pixel datum is given by F(5k−1)=(1×D(5k−1)/4)+(4×D(5k)/4. Here, k is a positive integer.

In this example, compared FIG. 4D to FIG. 4F, a digital image signal with a period 1.25 times that of the clock signal 301 is obtained. That is, a digital image signal with a frequency of four-fifths of the sampling rate is obtained.

An image is thus formed using the digital image signal finally thus obtained. If the frequency of the clock signal 401 in FIG. 4B is 100 MHz (period 10 ns), the frequency of the digital image signal in FIG. 4F is about 80 MHz (period 12.5 ns). It is assumed that one row of pixels is formed by one scan of an electron beam. It is further assumed that one row has 1024 pixels. Additionally, the timing for creating data corresponding to one row of pixel data is synchronized with that for each scan. The time required for one scan is 12.5 ns×1024=12.8 μs. Accordingly, 1024-pixel data are transmitted to a digital data transmitting section 207 every 12.8 μs.

In the example, the assumption has been made that the clock input to the AD conversion element 204 is constant. However, a plurality of clocks (e.g., 100 MHz, 80 MHz, 66.7 MHz, and 50 MHz) may be used. Even where a plurality of clocks are used, the present invention is able to provide a function similar to that described above.

The foregoing example does not refer to the number of bits of pixel data. However, the number of bits of the pixel data of the digital image signal obtained finally for image formation, which is shown in FIG. 3F and FIG. 4F, may be equal to the number of bits of the digital value of the sampling signal shown in FIG. 3D and FIG. 4D respectively.

Figure 5:
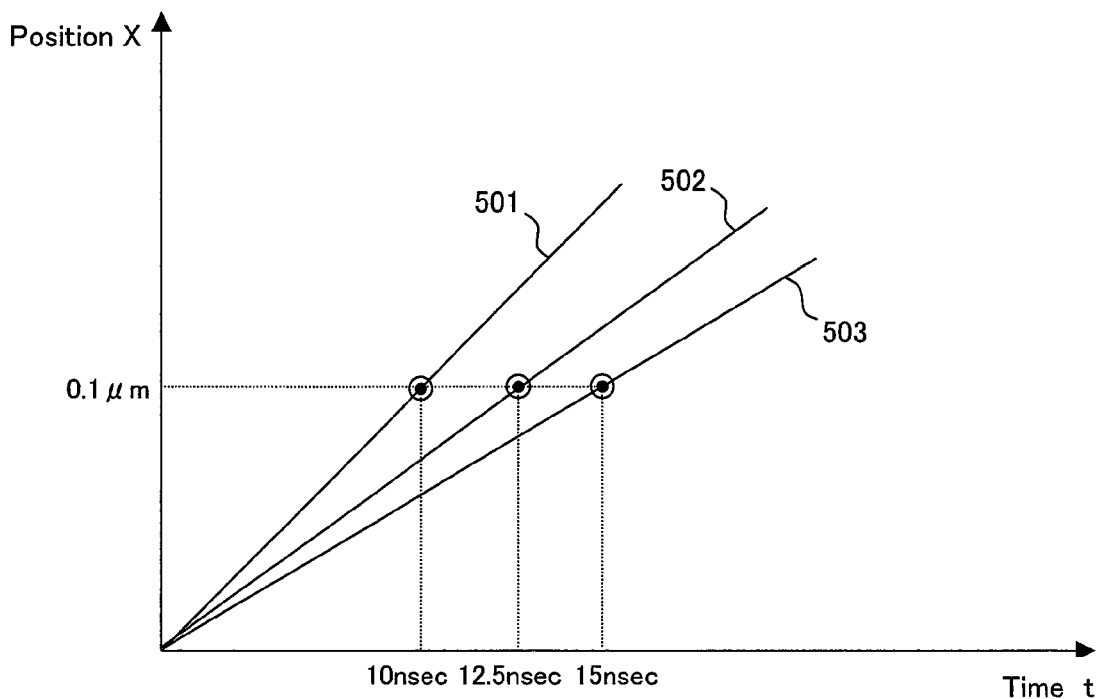
FIG. 5 is a view for illustrating the relation between the scanning speed and the sampling rate in the SEM type appearance inspection apparatus of the present invention.

Referring to FIG. 5, the relation between the scanning speed and the frequency of digital image signals for image formation, which is obtained by an arithmetic operation according to the present invention will be described. The vertical axis indicates a scanning location on a sample and the horizontal axis indicates a time. The slope of the graph indicates a scanning speed. Here, the sampling rate is assumed to be 100 Mz. The straight line 501 indicates the scanning speed where an image is formed using a sampling signal of frequency 100 Mz; the straight line 502 indicates the scanning speed where an image is formed using a digital image signal of frequency 80 MHz, which digital image signal has been obtained by the arithmetic operation according to the present invention; and the straight line 503 indicates the scanning speed where an image is formed using a digital image signal of frequency approximately 66.7 MHz, obtained by the arithmetic operation according to the present invention.

It is assumed that regardless of changes in the scanning speed of an electron beam, one pixel is created each time the electron beam scans a distance of 0.1 μm of a sample. The timing for creating data corresponding to a row of pixel data is synchronized with that for one scan. The scanning speed is proportional to the frequency of the digital image signal used for image formation. In the case of the straight line 501, an electron beam scans a distance of 0.1 μm of a sample in 10 ns, and accordingly, its scanning speed is 10 m/s. In the case of the straight line 502, an electron beam scans a distance of 0.1 m of a sample in 12.5 ns, and accordingly, its scanning speed is 8 m/s. In the case of the straight line 503, an electron beam scans a distance of 0.1 µm of a sample in 15 ns, and accordingly, its scanning speed is 6.67 m/s.

In the case of the straight line 501, the time required to emit an electron beam in order to create one pixel is 10 ns, which is equivalent to the time required to scan a distance of 0.1 µm. In the case of the straight line 502, the time required to emit an electron beam in order to create one pixel is 12.5 ns, which is equivalent to the time required to scan a distance of 0.1 µm. In the case of the straight line 503, the time required to emit an electron beam in order to create one pixel is 15 ns, which is equivalent to the time required to scan a distance of 0.1 µm.

The higher the frequency of the digital image signal for image formation is, the higher the scanning speed is. Accordingly, the time for which an electron beam is emitted decreases per pixel. That is, the strength of the luminance signal decreases, the SN ratio decreases, and accuracy in detecting defects also decreases. However, this shortens time for which an image is captured.

The lower the frequency of the digital image signal for image formation is, the lower the scanning speed is. Accordingly, the time for which an electron beam is emitted increases per pixel. That is, the strength of the luminance signal increases, the SN ratio is improved and accuracy in defect detection is also enhanced. However, this increases the time for which an image is captured.

According to the present invention, a user can select either improving throughput by shortening the time for which an image is captured, or increasing accuracy in defect detection by increasing the strength of the luminance signal and SN ratio, to give precedence to selected one over the other. In the case of giving precedence to both shortening the time for which an image is captured and improving throughput, a high frequency digital image signal may be produced by arithmetic operation. In the case of giving precedence to improving both the SN ratio and accuracy in defect detection, a low frequency digital image signal may be produced by arithmetic operation.

Figure 6:
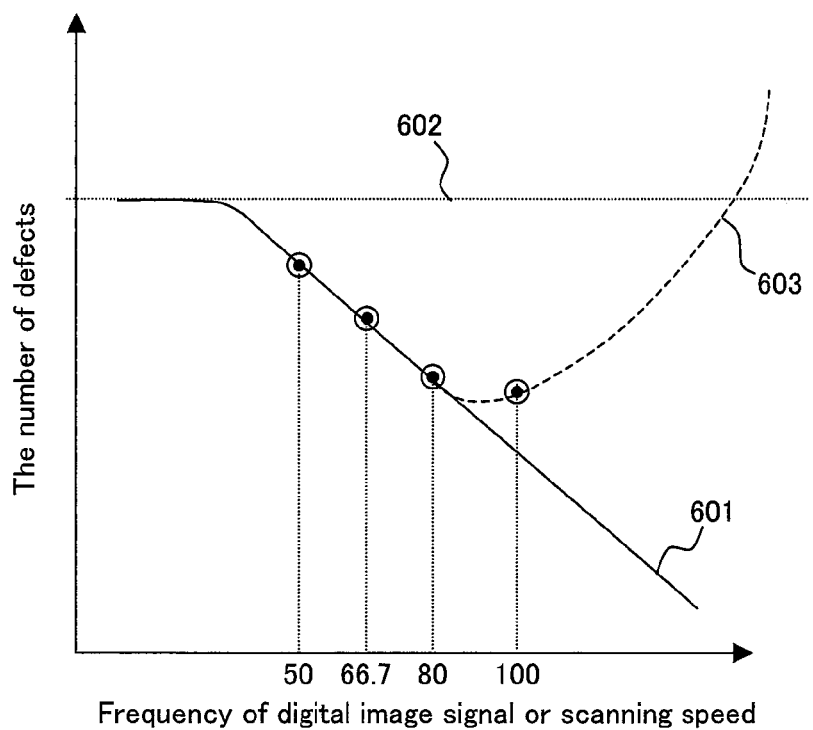
FIG. 6 is a view for illustrating the relation between the sampling rate (or scanning speed) and the number of detected defects in the SEM type appearance inspection apparatus of the present invention.

Referring to FIG. 6, the relations between the number of detected defects and the frequency of the digital image signal used for image formation will be described. The vertical axis indicates the number of detected defects. The horizontal axis indicates the frequency of a digital image signal used for image formation and obtained by the arithmetic operation in the present invention. The scanning speed is proportional to the frequency of the digital image signal used for image formation and, therefore, the horizontal axis may indicate the scanning speed.

The straight line 602 indicates the actual number of defects in a sample. The curve 601 indicates the number of defects detected by the appearance inspection apparatus in the present invention. The curve 602 indicates the number of defects detected falsely. As shown in FIG. 6, as the frequency of the digital image signal for image formation increases, the number of detected defects decreases and hence the number of defects detected falsely increases. The higher the frequency is, the higher the scanning speed is. Accordingly, the time per pixel for which an electron beam is emitted is shortened. Therefore, the strength of the luminance signal decreases, the SN ratio decreases and accuracy in defect detection decreases.

In order to increase the number of detected defects, as shown in FIG. 6, the frequency of the digital image signal for image formation is decreased. As a result, the scanning speed decreases, and the time per pixel for which an electron beam is emitted increases. Accordingly, this increases the strength of the luminance signal, and improves the SN ratio, and hence enhances accuracy in defect detection. However, the time taken to capture an image lengthens and the throughput degrades.

Figure 7:
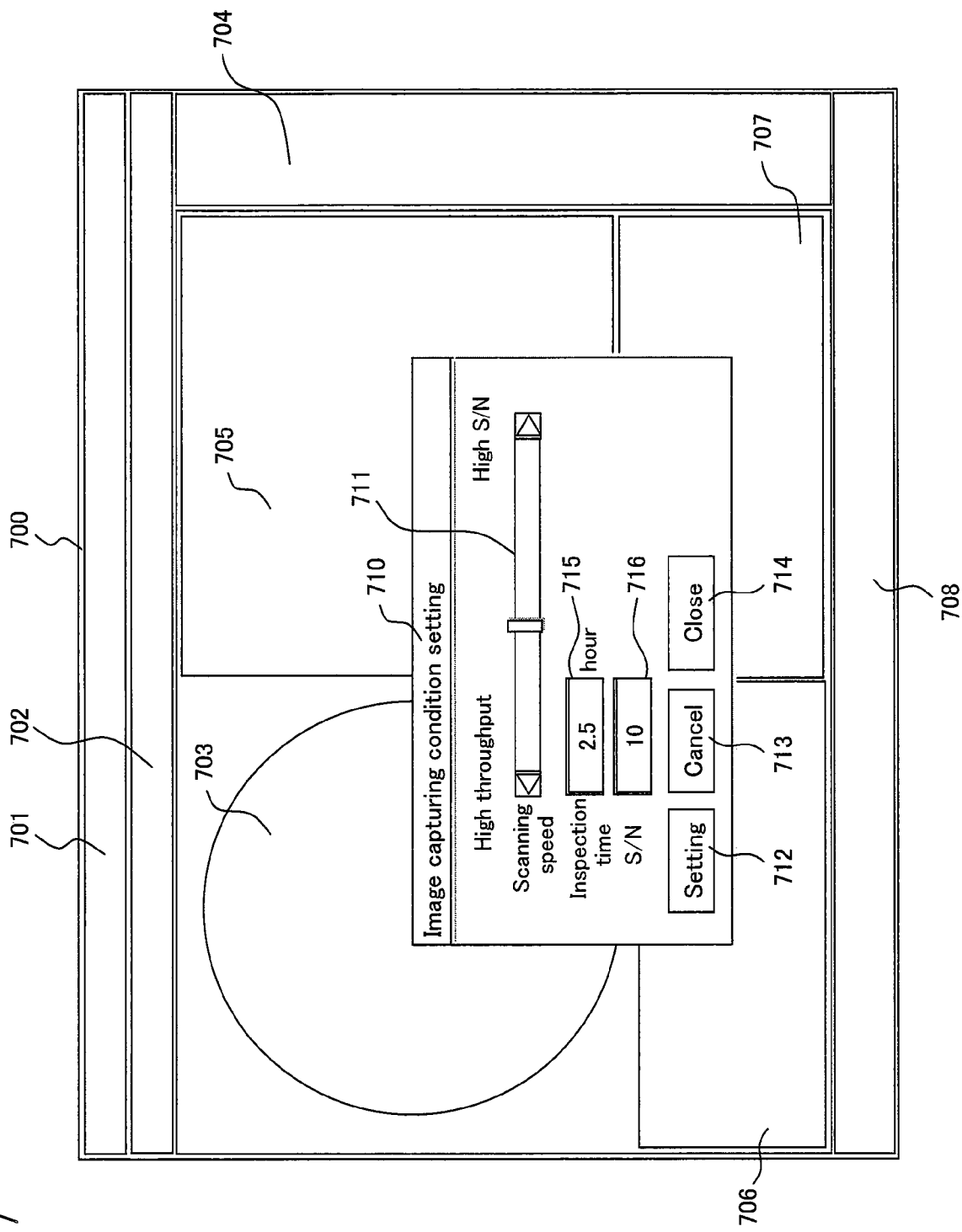
FIG. 7 is a view for illustrating an example of an input screen of the monitor of the SEM type appearance inspection apparatus of the present invention.

FIG. 7 shows an example of an input screen of the monitor 50 of the appearance inspection apparatus according to the present invention. The input screen 700 in this example has a message area 701, a message area 702 for input prompting, a map display area 703, a common button area 704, information display areas 705, 706, and 707, and a menu selection button area 708.

An image capturing condition setting window 710 has a slidax 711 that allows a user to select the frequency of the digital image signal for image formation or scanning speed. Thus, the user can set the frequency of the digital image signal for image formation obtained by the present invention or the scanning speed to any value by means of the slidax 711. In FIG. 7, adjacent to the slidax 711 is the sign reading 'Scanning Speed'. In an example shown in FIG. 7, using the slidax 711, the scanning speed can be set to any value. However, in lieu of the sign 'Scanning Speed,' 'Frequency of Digital Image Signal for Image Formation' may be displayed in order to allow a user to set the frequency of the digital image signal to any value by means of the slidax 711.

Adjacent to one end of the slidax 711 is the sign reading 'High Throughput.' Adjacent to the other end of the slidax 711 is the sign reading 'High S/N'. To give precedence to high throughput over high S/N, a user slides the lever of the slidax 711 in the direction of the sign 'High Throughput'. To give precedence to high S/N over high throughput, a user slides the lever of the slidax 711 in the direction of the sign 'High S/N'. Thus, the value of the frequency of the digital image signal for image formation or the scanning speed can be determined by the user's setting the lever of the slidax 711 to a desired position.

The image capturing condition setting window 710 has, for example, a setting button 712, a cancel button 713, a closing button 714 and the like disposed therein.

When a user sets the lever of the slidax 711 to a desired position and clicks on the setting button 712, the frequency of the digital image signal for image formation or scanning speed, entered using the slidax 711, is set. If a user clicks on the cancel button 713, the frequency or scanning speed entered using the slidax 711 is canceled. When a user clicks on the closing button 714, the image capturing condition setting widow 710 is closed.

The image capturing condition setting window 710 has an inspecting time display field 715 and an S/N display field 716. The inspecting time display field 715 and the S/N display field 716 display the inspecting time and S/N calculated from the frequency of the digital image signal for image formation or the scanning speed set using the slidax 711, respectively.

The layouts of the area of the input screen in this example may vary from the layout shown in FIG. 7, which is just an example and the present invention is not limited thereto. For instance, when a user clicks on a button shown in the common button area 704, the input screen 700 may display the image capturing condition setting window 710.

Figure 8:
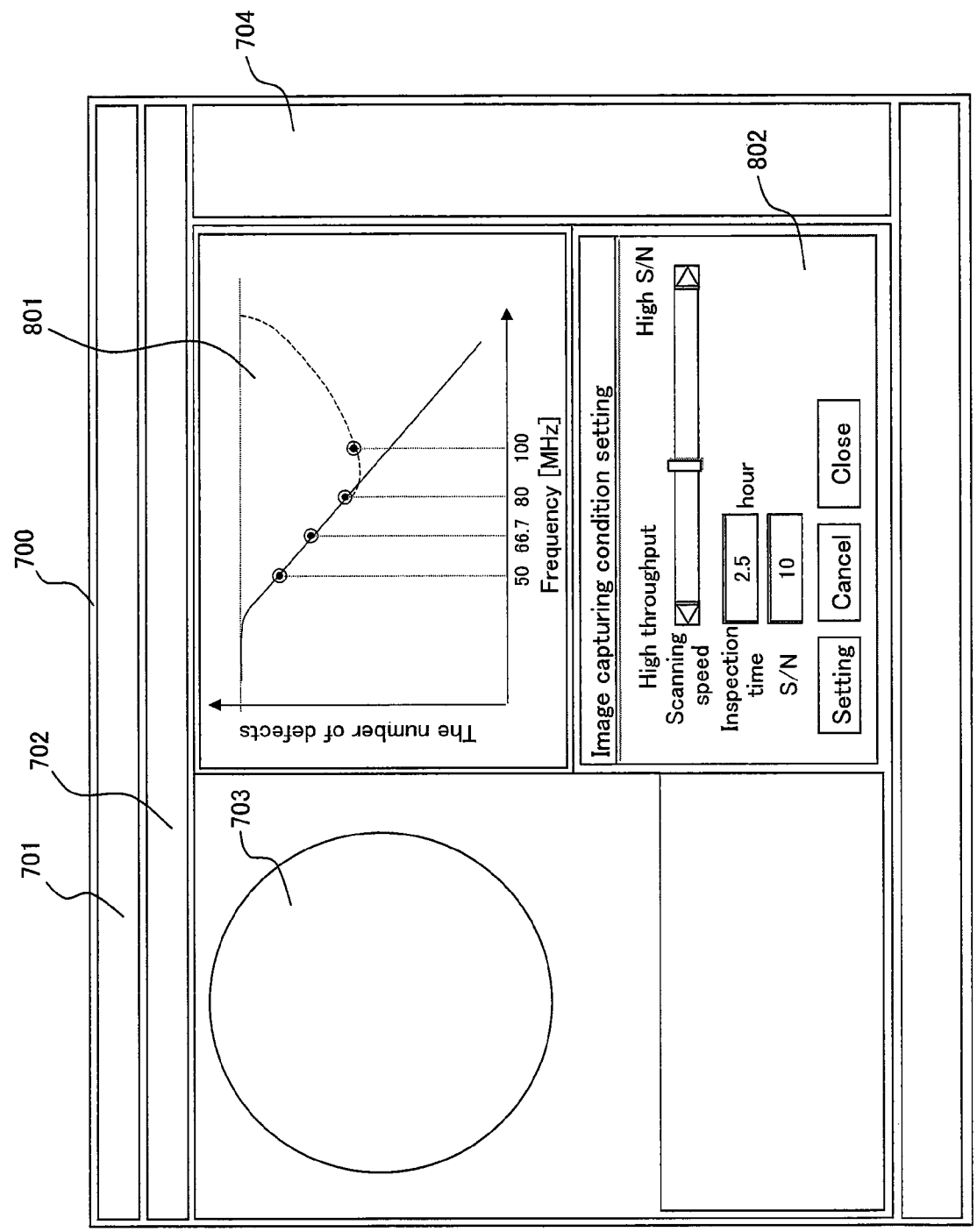
FIG. 8 is a view for illustrating another example of an input screen of the monitor of the SEM type appearance inspection apparatus of the present invention.

FIG. 8 shows another example of the input screen of the monitor 50 of the appearance inspection apparatus in the present invention. In the input screen in this example, a graph 801 as shown in FIG. 6 is displayed in an information display area 705 of the input screen shown in FIG. 7. The input screen in this example also displays an image capturing condition setting window 802. A user may inspect defects on a trial basis for a short time while changing setting values on the image capturing condition setting screen 802. This makes it possible to generate data about the relation between the frequency of a digital image signal used for image formation (or the scanning speed) and the number of defects. Based on this data, the graph 801 can be displayed on the input screen. A user may then find the optimum condition from this graph. In this example, a table may be shown in lieu of the graph 801.

DESCRIPTION OF THE REFERENCE NUMERALS

1 . . . SEM type appearance inspection apparatus, 2 . . . inspection chamber, 3 . . . electron optical system 4 . . . optical microscope, 5 . . . image processor, 6 . . . control unit, 7 . . . secondary electron detecting unit, 8 . . . sample chamber, 9 . . . sample, 10 . . . electron gun, 11 . . . extraction electrode, 12 . . . condenser lens, 13 . . . blanking deflector, 14 . . . aperture, 15 . . . scanning deflector, 16 . . . objective lens, 17 . . . beam reflector, 18 . . . E×B deflector, 19 . . . electron beam, 20 . . . secondary electron detector, 21 . . . preamplifier, 22 . . . AD converter, 23 . . . optical conversion means, 24 . . . optical transmission means 25 . . . electric conversion means, 26 . . . high voltage power source, 27 . . . preamplifier driving power source, 28 . . . driving power source, 29 . . . reverse bias power source, 30 . . . sample support, 31 . . . X stage, 32 . . . Y stage, 34 . . . position-monitoring length-measuring device, 35 . . . inspected sample height measuring device, 36 . . . high voltage power source, 40 . . . light source, 41 . . . optical lens, 42 . . . CCD camera, 43 . . . correction control circuit, 44 . . . scanning signal generator, 45 . . . objective lens power source, 46 . . . first image storage section, 47 . . . second image storage section, 48 . . . differential image storage section, 49 . . . defect determining section, 50 . . . monitor, 51 . . . secondary electron, 52 . . . second secondary electron, 204 . . . AD conversion element, 205 . . . clock generating circuit, 206 . . . digital signal processing circuit, 206 . . . digital signal transmitting section, 300 . . . analog signal, 301 . . . clock signal, 302 . . . sampling signal, 303 . . . digital value of sampling signal, 304 . . . digital value of digital image signal for image formation, 400 . . . analog signal, 401 . . . clock signal, 402 . . . sampling signal, 403 . . . digital value of sampling signal, 404 . . . digital value of digital image signal for image formation, 700 . . . input screen, 701 . . . message area, 702 . . . a message area for input prompting, 703 . . . map display area, 704 . . . common button area, 705, 706, 707 . . . information display area, 708 . . . menu selection button area, 710 . . . image capturing condition setting window, 711 . . . slidax, 712 . . . setting button, 713 . . . cancel button, 714 . . . closing button, 715 . . . inspecting time display field, 716 . . . S/N display field, 801 . . . graph representing relation between the number of detected defects and frequency (or scanning speed), 802 . . . image capturing condition setting window.

What is claimed is:

1. An appearance inspection apparatus comprising: a scanning deflector for scanning a surface of a sample with an electron beam; an objective lens for focusing the electron beam onto the sample; a detector for producing an analog luminance signal by detecting a secondary electron or reflected electron generated by the sample; an AD conversion element for sampling the analog luminance signal at a predetermined sampling rate; a digital signal processor for producing a digital image signal from a sampling signal obtained by the AD conversion element, the digital image signal having a lower frequency than the sampling rate; an image processor for forming an image in which each pixel is created from each of the digital values of the digital image signal; and an input device for allowing a user to enter data; and wherein the user is allowed to select via the input device the frequency of the digital image signal or a ratio of the frequency of the digital image signal to the sampling rate.

2. The appearance inspection apparatus according to claim 1, wherein the user is allowed to select either throughput improvement or S/N improvement to give precedence to selected one, via the input, wherein if the user selects the throughput improvement to prioritize, the digital signal processor sets the frequency of the digital image signal or scanning speed to a relatively large value, while if the user selects the S/N improvement to prioritize, the digital signal processor sets the frequency of the digital image signal or scanning speed to a relatively small value.

3. The appearance inspection apparatus according to claim 1, further comprising a monitor for displaying an input screen that allows a user to enter the data, wherein the input screen displays an image capturing condition setting window provided with a slidax having a lever movable by the user, and wherein the digital single processor sets the frequency of the digital image signal or the scanning speed according to a position of the lever.

4. The appearance inspection apparatus according to claim 3, wherein the user is allowed to select either throughput improvement or S/N improvement to give precedence to by selecting the position of the lever.

5. The appearance inspection apparatus according to claim 3, wherein the image capturing condition setting window has an inspecting time display field and an S/N display field, wherein the inspecting time display field displays an inspecting time calculated from the frequency of the digital image signal or the scanning speed, which has been set by the slidax, while the S/N display field displays an S/N calculated from the frequency of the digital image signal or the scanning speed, which has been set by the slidax.

6. The appearance inspection apparatus according to claim 3, wherein the input screen displays a graph representing a relation between the number of detected defects and the frequency of the digital image signal or the scanning speed.

7. The appearance inspection apparatus according to claim 6, wherein the graph is created based upon the frequency of the digital image signal or the scanning speed, which has been set by the slidax.

8. The appearance inspection apparatus according to claim 1, wherein the digital signal processor subjects each series of a predetermined number of successive digital values of the sampling signal to addition and division, to yield a series of a smaller number of successive digital values than the predetermined number, and produces the digital image signal in which each of the generated digital values constitutes one pixel.

9. The appearance inspection apparatus according to claim 1, wherein the digital signal processor performs processing such that if the successive digital values of the sampling signal are $D_1, D_2, D_3, D_4$, and so on and the successive digital values of the digital image signal are $E_1, E_2, E_3, E_4$, and so on, the odd-ordinal numbered digital value in the digital image signal is given by $E(2k-1)=D(3k-2)+D(3k-1)/2$ and the even-ordinal numbered digital value is given by $E(2k)=D(3k-1)/2+D(3k)$ (where k is a positive integer).

10. The appearance inspection apparatus according to claim 1, wherein the digital signal processor performs processing such that if the successive digital values of the sampling signal are $D_1, D_2, D_3, D_4$, and so on and the successive digital values of the digital image signal are $F_1, F_2, F_3, F_4$, and so on, $(5k-4)$-th pixel datum in the digital image signal is given by $F(5k-4)=(4\times D(5k-4)/4)+(1\times D(5k-3)/4$; $(5k-3)$-th pixel datum is given by $F(5k-3)=(3\times D(5k-3)/4)+(2\times D(5k-2)/4)$; (5k-2)-th pixel datum is given by $F(5k-2)=(2\times D(5k-2)/4)+(3\times D(5k-1)/4)$; and (5k-1)-th pixel datum is given by $F(5k-1)=(1\times D(5k-1)/4)+(4\times D(5k)/4$ (where k is a positive integer).

11. An image data processing method comprising:

scanning a surface of a sample with an electron beam by using a scanning deflector;

focusing the electron beam onto the sample by using an objective lens;

producing an analog luminance signal by detecting a secondary electron or reflected electron generated by the sample;

producing a sampling signal by sampling the analog luminance signal at a predetermined sampling rate;

producing from the sampling signal a digital image signal that has a lower frequency than the sampling rate;

forming an image so that each of digital values of the digital image signal constitutes one pixel; and wherein the digital image signal is obtained based on a frequency of the digital image signal inputted by a user via an input device or a ratio of the frequency of the digital image signal to the sampling rate.

12. The image data processing method according to claim 11, wherein if the user selects throughput improvement to give precedence to via an input device, the frequency of the digital image signal or a scanning speed is set to a relatively large value, while the user selects S/N improvement to give precedence to via the input device, the frequency of the digital image signal or scanning speed is set to a relatively small value.

13. The image data processing method according to claim 11, further comprising:

displaying on a monitor an input screen that allows a user to enter data; and displaying on the input screen an image capturing condition setting window provided with a slidax having a lever movable by the user;

wherein the user is allowed to select the lever to a predetermined position, thereby setting the frequency of the digital image signal or the scanning speed according to the desired position of the lever.

14. The image data processing method according to claim 13, wherein the user is allowed to select throughput improvement or S/N improvement to give precedence to by selecting the position of the lever.

15. The image data processing method according to claim 13, further comprising:

displaying an inspecting time display field and an S/N display field in the image capturing condition setting window;

displaying in the inspecting time display field an inspecting time calculated from the frequency of the digital image signal or the scanning speed, which has been set by the slidax; and displaying in the S/N display field an S/N calculated from the frequency of the digital image signal or the scanning speed, which has been set by the slidax.

16. The image data processing method according to claim 13, wherein the input screen displays a graph representing a relation between the number of detected defects and the frequency of the digital image signal or the scanning speed.

17. The image data processing method according to claim 16, wherein the graph is created based upon the frequency of the digital image signal or the scanning speed, which has been set by the slidax.

* * * * *